(12) United States Patent
Sosnowski

(10) Patent No.: US 7,038,124 B1
(45) Date of Patent: May 2, 2006

(54) TWO-PIECE EMI SHIELDING VENT PANEL

(75) Inventor: Anthony Sosnowski, Strousburg, PA (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 0 days.

(21) Appl. No.: 10/717,860

(22) Filed: Nov. 19, 2003

Related U.S. Application Data (60) Provisional application No. 60/427,400, filed on Nov. 19, 2002.

(51) Int. Cl.
*H05K 9/00* (2006.01)

(52) U.S. Cl. .............................. 174/35 MS; 174/35 R; 454/184

(58) Field of Classification Search ........... 174/35 MS, 174/35 R; 361/692, 693, 800, 816, 818; 454/184
See application file for complete search history.

(56) References Cited

U.S. PATENT DOCUMENTS

| | | | | |
|---|---|---|---|---|
| 3,546,359 A * | 12/1970 | Kaufman et al. | ...... | 174/35 MS |
| 3,580,981 A * | 5/1971 | Lamp et al. | ........... | 174/35 MS |
| 3,821,463 A * | 6/1974 | Bakker | ................... | 174/35 MS |
| 6,211,458 B1* | 4/2001 | Mitchell et al. | .......... | 174/35 R |
| 6,426,459 B1* | 7/2002 | Mitchell | ................ | 174/35 MS |
| 6,610,922 B1* | 8/2003 | Twiss et al. | ........... | 174/35 MS |
| 6,710,241 B1* | 3/2004 | Casper | .................. | 174/35 MS |

* cited by examiner

*Primary Examiner*—Dean A. Reichard
*Assistant Examiner*—Adolfo Nino
(74) *Attorney, Agent, or Firm*—Harness, Dickey & Pierce, P.L.C.

(57) ABSTRACT

An EMI shielding vent panel is provided for electronic equipment housings. The vent panel advantageously provides a simple and efficient construction through the use of a two-piece frame.

11 Claims, 9 Drawing Sheets

TWO-PIECE EMI SHIELDING VENT PANEL

This application claims priority under 35 U.S.C. §119(e) from Provisional Application No. 60/427,400 filed Nov. 19, 2002, which is herein incorporated by reference.

FIELD OF THE INVENTION

The present invention relates to two-piece EMI shielding vent panels and more particularly to two-piece EMI shielding vent panels having a honeycomb structured filtering media.

BACKGROUND OF THE INVENTION

The use of vent panels for shielding electronic devices from electromagnetic interference ("EMI") has been known for years. Typically, the vent panels utilize a filtering media being an electrically conductive (e.g., metallic) honeycomb structure, which is particularly effective in dissipating EMI from electronic equipment.

EMI shielding vent panels have found wide application in military equipment and high-performance electronic test equipment, where cost considerations are outweighed by performance requirements such as shielding effectiveness and ruggedness. One significant factor affecting costs is that the frames for such shielding vent panels are produced from welded aluminum extrusions. For a majority of commercial applications, the requirements for EMI shielding do not necessitate the use of these honeycomb vent panels.

However, the development of microprocessors with increasing clock frequencies for computer and telecommunication equipment now necessitates the use of honeycomb vent panels for EMI shielding. Unfortunately, current vent panel constructions do not facilitate the use of these honeycomb vent panels in commercial applications due to manufacturing costs associated with extruded aluminum frames.

One attempt to bypass the necessity of aluminum extruded frames is the use of stamped or die-cut sheet metal frames as disclosed in U.S. Pat. No. 6,426,459 to Mitchell. The disclosed frames are a one-piece structure with a series of spaced-apart tabs provided in at least one of the frame side walls to effect electrical contact with the honeycomb structured filtering media. While the disclosed frame obviates the need for aluminum extrusions, construction of the vent panel still requires significant metal working to effect electrical contact between the frame and the honeycomb filtering media.

In view of the above, there is a need in the art for vent panel constructions that facilitate their use in commercial applications. Accordingly, it is an object of the invention to provide EMI shielding vent panels with simpler and more efficient constructions.

SUMMARY OF THE INVENTION

The present invention provides an EMI shielding vent panel adapted for a corresponding aperture in a housing for electronic equipment. The panel of the invention includes a two-piece, electrically conductive frame having a perimeter defining a closed geometry adapted to enclose the aperture of the housing that is to be fitted with the vent panel. Each frame piece of the vent panel includes a side wall having first and second edges and an end wall extending from each first edge. Each side wall additionally has inner and outers surfaces. The frame is assembled so that the end walls of each frame piece are disposed in an abutting orientation thereby positioning the inner surfaces of the side walls in an opposing orientation. The vent panel additionally includes an electrically-conductive media comprising a plurality of ventilation cells extending along a transverse axis intermediate a pair of faces, where the cells define a perimeter for the media and the media is disposed intermediate the inner surfaces of the side walls of the frame pieces. In accordance with the invention, the frame pieces are secured to each other and to the electrically-conductive media to provide electrical contact between the frame and the electrically-conductive media.

Advantageously, the EMI vent panel of the present invention provides a simpler and more efficient construction than achieved with prior art vent panels by avoiding the requirement of one-piece metal frames. Other advantages of the vent panel of the present invention will become more readily apparent from the description set forth below.

DETAILED DESCRIPTION OF THE INVENTION

Figure 1:
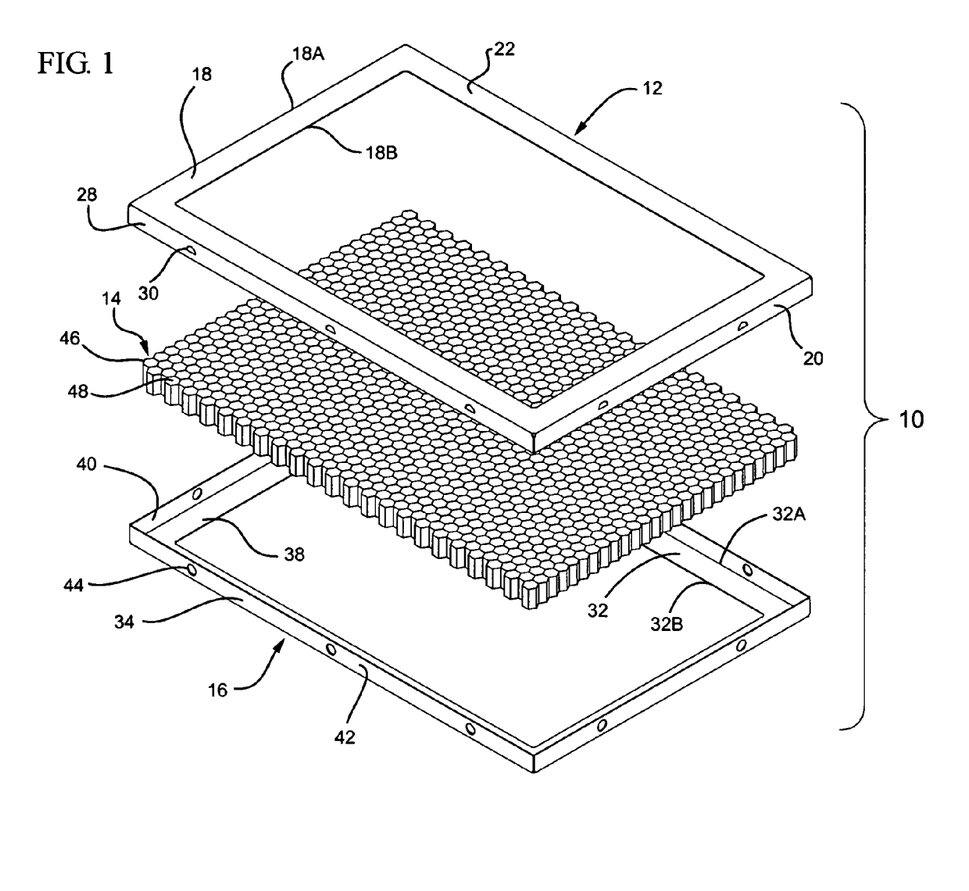
FIG. 1 is an exploded view of preferred embodiment of the two-piece honeycomb vent panel of the invention.

Referring to FIG. 1, a preferred embodiment of a two-piece electromagnetic interference (EMI) shielding vent panel 10 is illustrated. Vent panel 10 is adapted for use with a corresponding aperture of electronic equipment housing in which shielding from EMI is desired. As shown in FIG. 1, vent panel 10 includes a first frame piece 12 and a second frame piece 16 with an electrically-conductive filtering media 14 disposed therebetween. Advantageously, the use of a two-piece frame 12 and 16 allows for a simpler and more efficient assembly as compared to single-piece frames used in the art.

Frame pieces 12, 16 and media 14 are shown in FIG. 1 having generally rectangular dimensions. However, as will be recognized by those skilled in the art, frame pieces 12, 16 and media 14 can have any polygonal geometry sized to enclose a similarly dimensional vent opening (or aperture) in the housing for electronic equipment.

As shown in FIG. 1, first frame piece 12 include side walls 18 each having first and second edges 18A and 18B, respectively, and outer and inner surfaces 22 and 24, respectively. Inner end wall surfaces 24 are not depicted in FIG. 1 due to the viewing angle. Each of end walls 20 extend from first edge 18A at a generally right angle. End walls 20 can extend from first edges 18A as a continuous length of material or as depicted in FIG. 1 as a partitioned length of material. End walls 20 also include inner and outer surfaces 26 and 28, respectively. Inner end wall surfaces 26 are also not depicted in FIG. 1 due to the viewing angle.

Second frame piece 16 is similarly dimensioned to first frame piece 12 thereby allowing the two frame pieces to be mateable to form a completed frame. Second frame piece 16 includes side walls 32 each having first and second edges 32A and 32B, respectively, and outer and inner surfaces, 36 and 38, respectively. Outer side wall surface 36 is not depicted in FIG. 1 due to the viewing angle. Each of end walls 34 extend from first edge 32A at a generally right angle. As with first frame piece 12, end walls 34 can extend from first edges 32A as either a continuous length of material or as depicted in FIG. 1 as a partitioned length of material. Each of end walls 34 also includes inner and outer surface 40 and 42, respectively.

Figure 2:
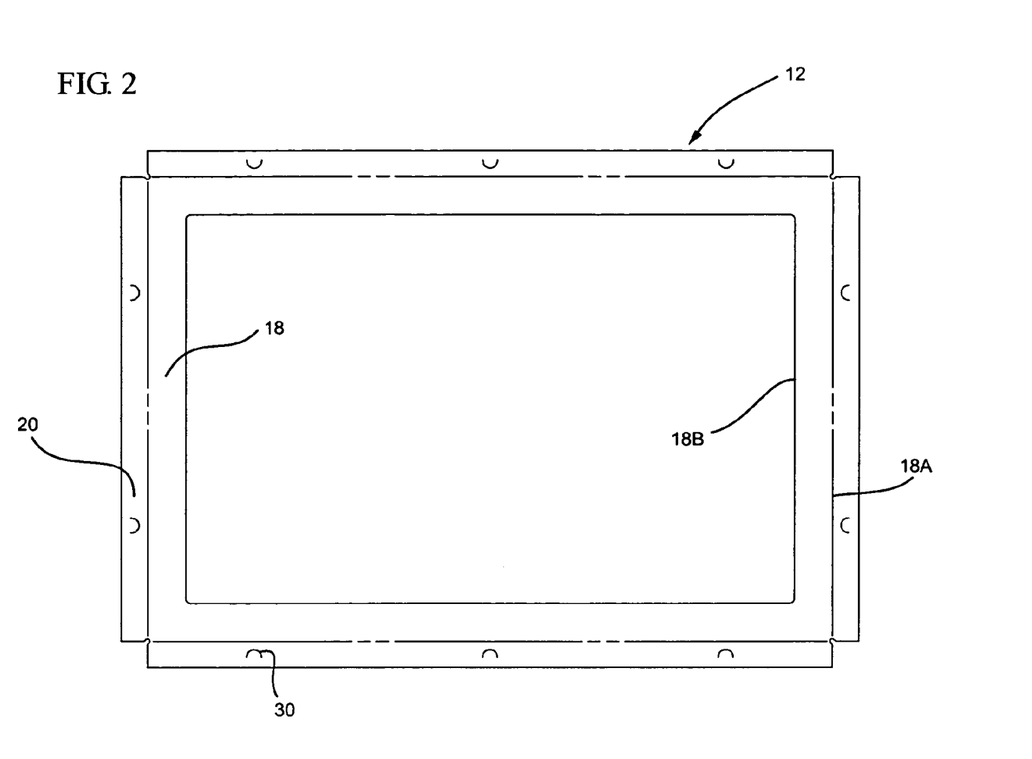
FIG. 2 is plan view of a stamped metal blank for a first piece of the two-piece frame of the vent panel shown in FIG. 1.
Figure 3:
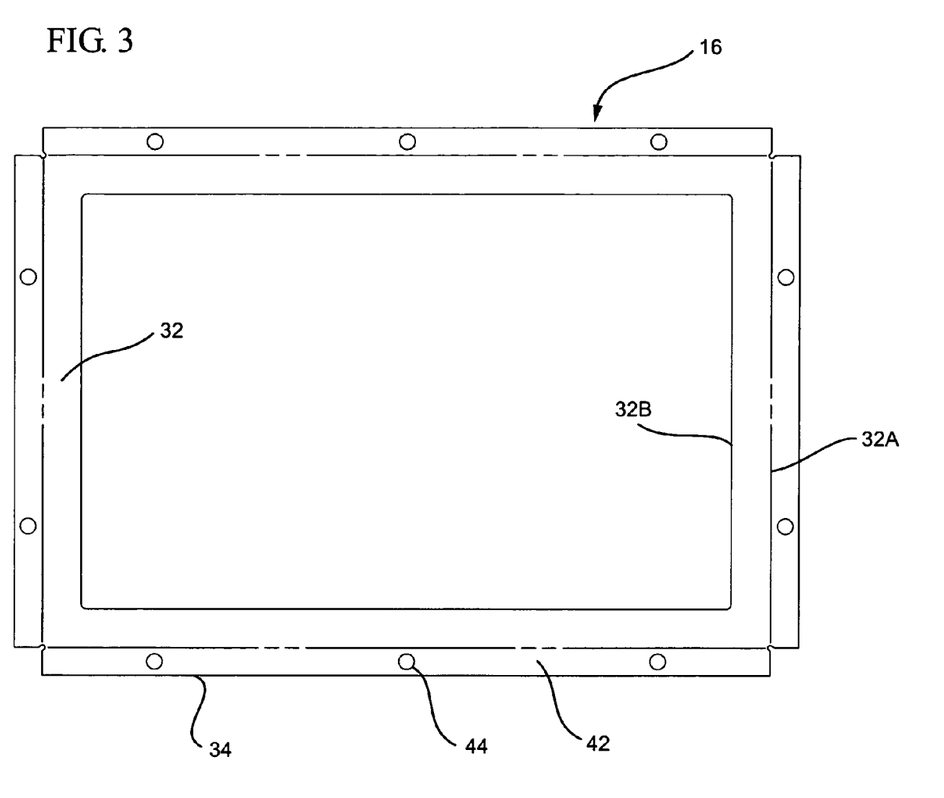
FIG. 3 is a plan view of a stamped metal blank for a second piece of the two-piece frame of the vent panel shown in FIG. 1.

Frame pieces 12, 16 are formed from sheet metal using any stamping or die-cut process. Advantageously, the production of stamped or die-cut frame pieces avoids miter cuts and corner welding commonly associated with conventional extruded metal frames. In addition, the use of a two-piece frame reduces the assembly time for the vent panel since minimal metal working is required to effect electrical contact between frame pieces 12, 16 and filtering media 14. Sheet metals to be used include, but are not limited to, aluminum, carbon steel, stainless steel, copper alloys and possible combinations thereof. Plan views of sheet metal blanks for forming frame pieces 12 and 16 are shown in FIGS. 2 and 3, respectively.

Returning to FIG. 1, electrically-conductive filtering media 14 is disposed intermediate frame pieces 12, 16 with the inner side wall surfaces 24 and 38, respectively, being disposed in an opposing orientation. Media 14 is similarly dimensioned to frame pieces 12, 16 to facilitate retention of media 14 by inner side wall surfaces 24 and 38. However, as will be apparent to one skilled in the art, the perimeter of media 14 is preferably less that the perimeters provided by frame piece 12,16. As shown in FIG. 1, media 14 is generally planar although other cross-sectional profiles can be used. Media 14 is composed of a plurality of ventilation cells 46 extending along a traverse axis intermediate a pair faces 48, 50 (50 not shown in FIG. 1). Media 14 can be in the form of an expanded metal mesh (or screen) and is preferably in the form a honeycomb structure. Electrically-conductive honeycomb filtering media are well known in the art as found in representative U.S. Pat. Nos. 3,546,359; 3,589,981; and 3,821,463. Reference to "ventilation cells" means open-cells that allow the ingress and egress of air thereby providing air flow to and from the housing (or enclosure) associated with the vent-panel of the invention.

Figure 4:
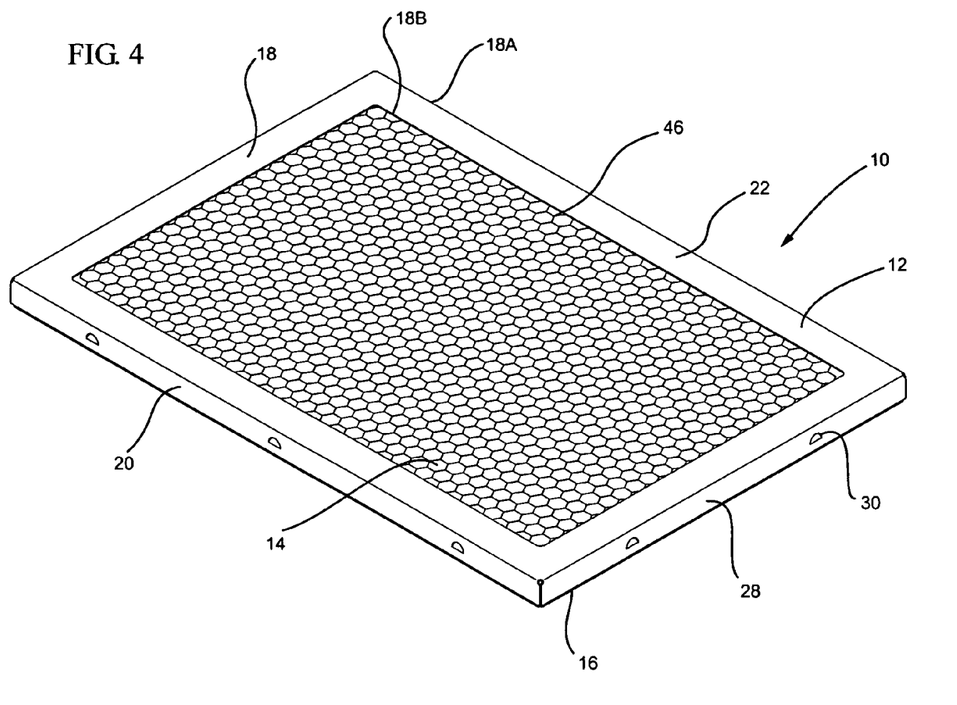
FIG. 4 is a top perspective view of the assembled vent panel shown in FIG. 1.
Figure 5:
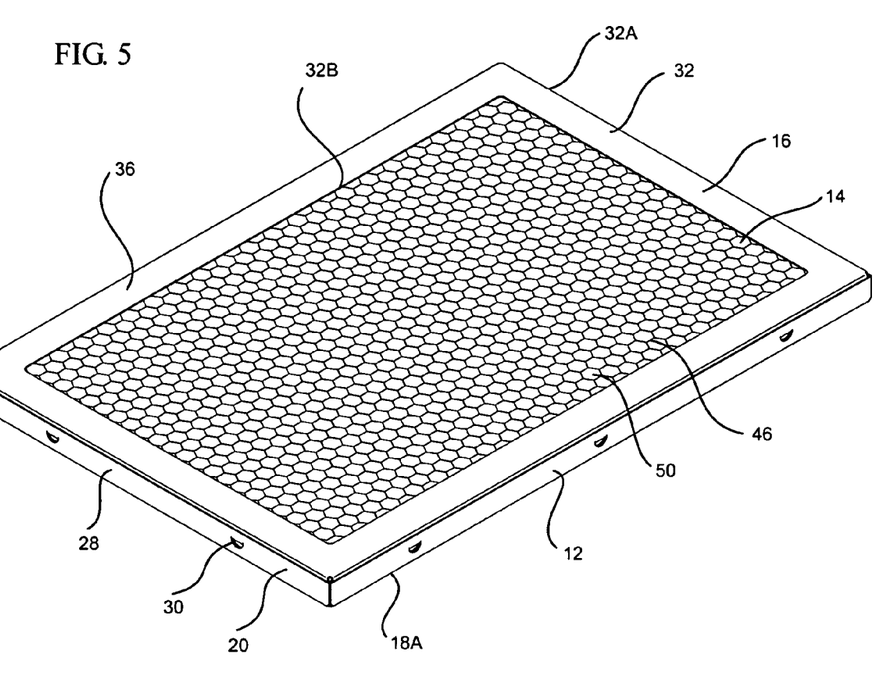
FIG. 5 is a bottom perspective view of the assembled vent panel shown in FIG. 1.

In accordance with the invention, the oppositely positioned frame pieces 12, 16 are mated so that each of end walls 20, 34 are disposed in an abutting relationship and preferably are at least partially overlapping. In a preferred embodiment, one of the two frame pieces 12, 16 is of a dimension (i.e., has a slightly smaller perimeter) to allow insertion of one frame piece into another as depicted in FIGS. 4 and 5. FIG. 4 shows a top view of vent panel 10 composed of frame piece 12 with second frame piece 16 disposed therein where media 14 is disposed intermediate inner side wall surfaces 24, 38, respectively. Likewise, FIG. 5 shows a bottom view of vent panel 10. Reference to top and bottom views are meant for illustration purposes only and are not meant to be limiting in the context of the invention.

Figure 6:
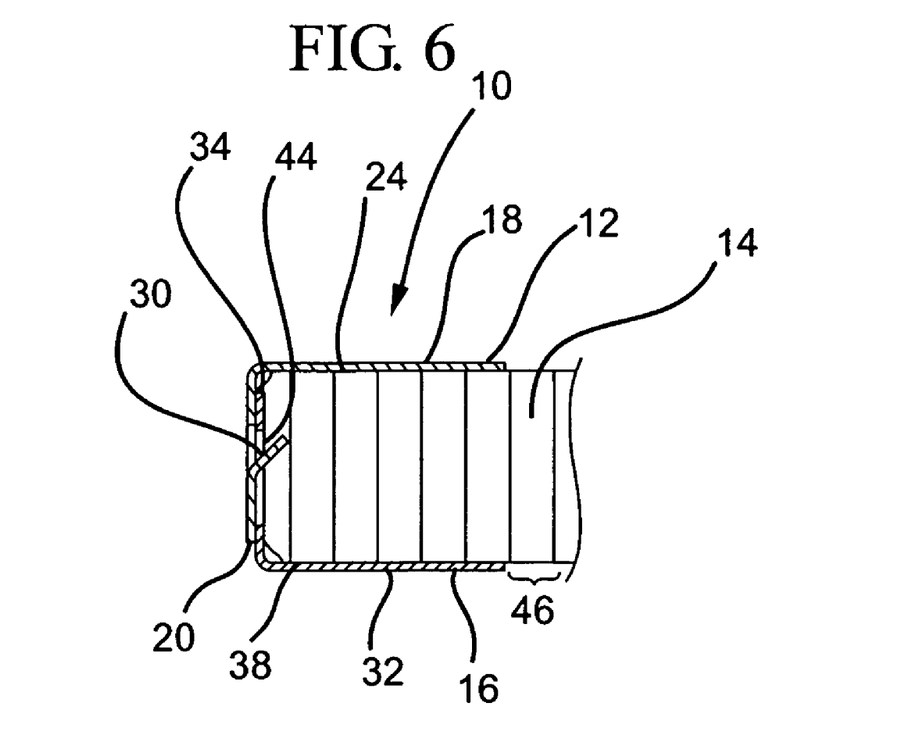
FIG. 6 is a partial cross-sectional view of the assembled vent panel shown in FIG. 1.
Figure 9:
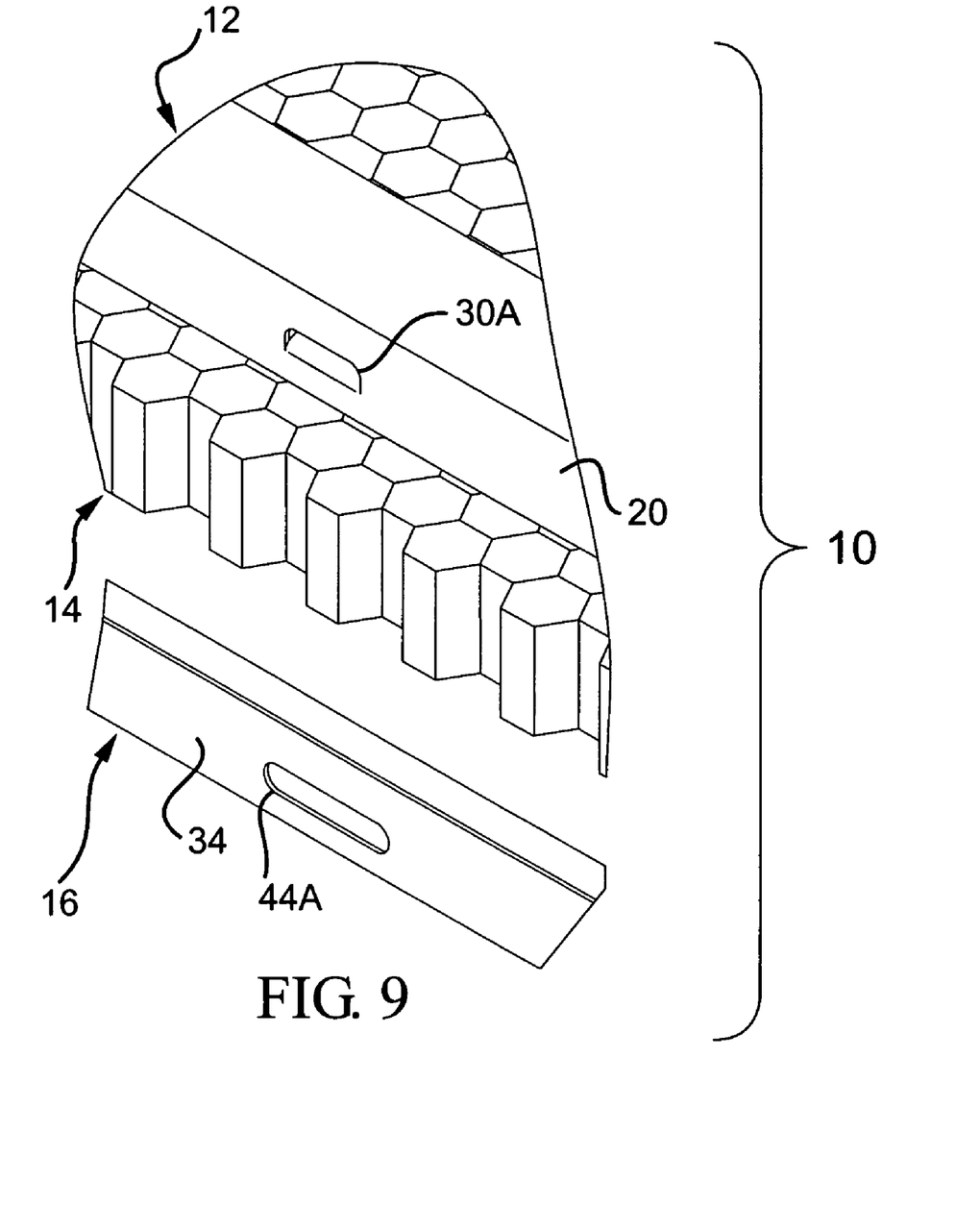
FIG. 9 is a partial exploded view of the vent panel of the invention with a rectangular lance/aperture locking mechanism.

The components of vent panel 10 upon assembly are secured using a variety of techniques. At a minimum, end walls 20, 34 are secured to each other in an abutting and preferably at least partially overlapping orientation. In accordance with the invention, frame pieces 12, 16 can be secured to media 14 through oppositely positioned side walls 18, 32, end walls 20, 34 or a combination of the two. Techniques of securing frame pieces 12, 16 include but are not limited to, welding, riveting, threaded fasteners, electrically conductive adhesives, crimping and combinations thereof. A cross-section of one embodiment having end walls 20, 34 secured to each other and media 14 is illustrated in FIG. 6. In FIG. 6, end wall 20 and end wall 34 are in an abutting and overlapping orientation with end wall 20 distal to media 14 while end wall 34 is proximal to media 14. End wall 20 includes lance 30, while end wall 34 includes aperture 44 disposed substantially opposite from lance 30 to engage lance 30 in addition to providing access to media 14. Frame pieces 12, 16 and media 14 are secured (i.e., locked to each other) using this lance/aperture configuration by deforming (e.g., pushing) lance 30 through aperture 44 to preferably project into media 14 as shown in FIG. 6. Deformed lance 30 thus secures and provide electrical continuity between frame pieces 12, 16 and media 14. Referring to FIG. 1, frame pieces 12, 16 are preferably provided with a series of spaced apart lances 30 and a corresponding series of spaced apart apertures 44, respectively. Moreover, in accordance with the invention, the configuration of lance 30 and aperture 44 is variable (e.g., semi-circular geometry, a polygonal geometry such as a square or rectangle, etc.). For example, FIG. 9 shows a partial exploded view of frame pieces 12, 16 and media 14 in which end walls 20, 34 are respectively provided with rectangular lances 30A and corresponding oblong apertures 44A for locking.

Figure 7:
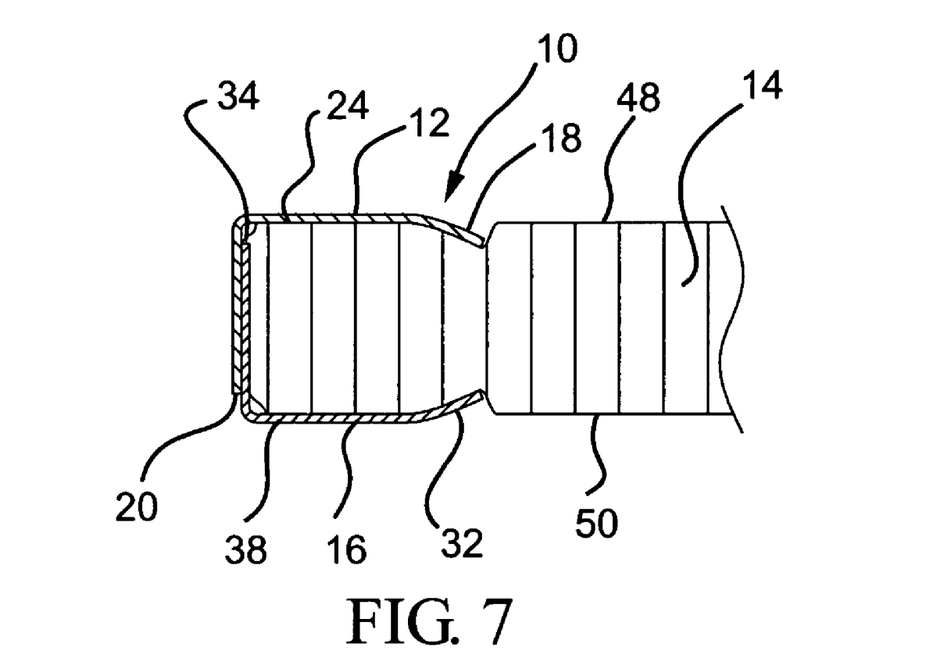
FIG. 7 is a partial cross-sectional view of an alternative embodiment of the assembled vent panel of the invention.

In another embodiment as shown in FIG. 7, frame pieces 12, 16 are secured to media 14 through side walls 18, 32. Frame pieces 12, 16 are secured to each other by end walls 20, 34 being disposed in an abutting and overlapping orientation. The end walls 20, 34 are secured using any of the previously described techniques. Side walls 18, 32 are deformed (e.g., crimped) to project into media 14 which is intermediate side walls 18, 32 thereby established electrical continuity between media 14 and frame pieces 12, 16.

Figure 8:
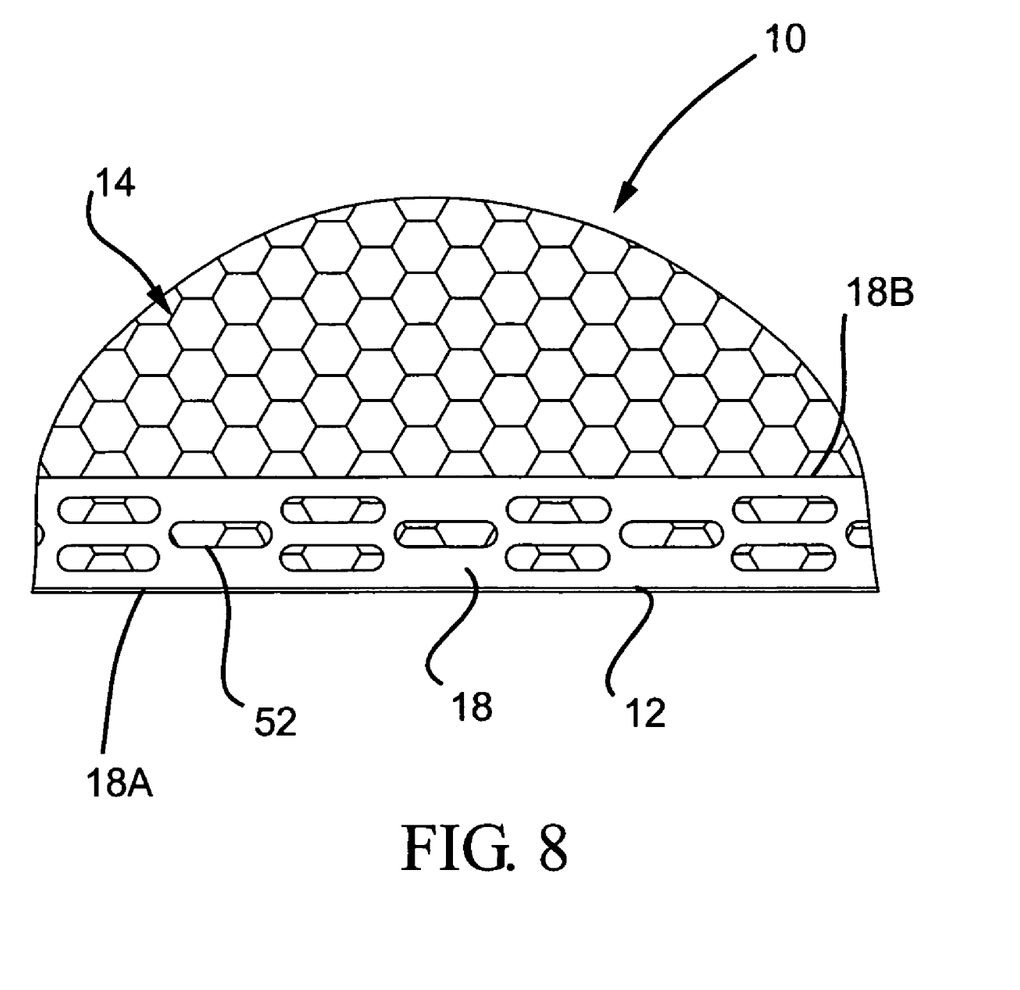
FIG. 8 is a partial plan view of the vent panel of the invention with optional ventilation apertures in the frame.

In an optional embodiment, side walls 18, 32 can be provided with ventilation apertures 52 to provide additional air flow through media 14. FIG. 8 is a partial plan view of vent panel 10 including a plurality of ventilation apertures 52 disposed in side wall 18 at positions intermediate first and second edges 18A, 18B. As will be apparent to one skilled in the art, the configuration of ventilation apertures is variable and can be easily modified.

Figure 10:
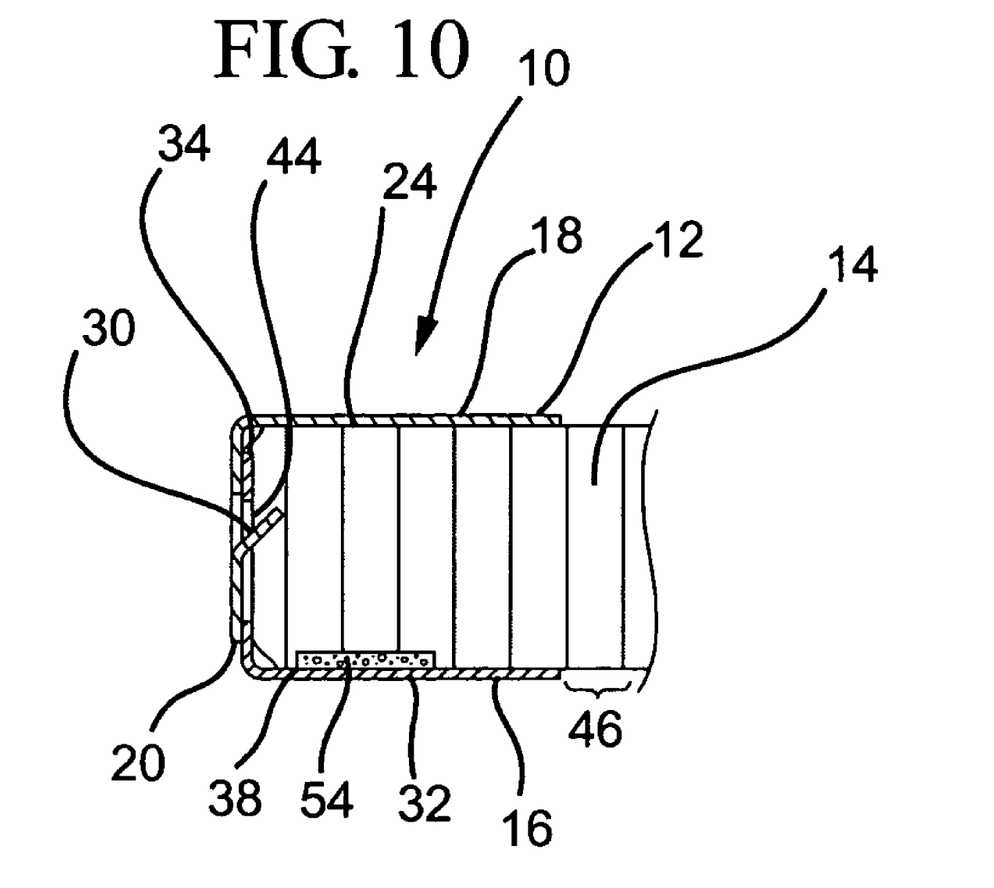
FIG. 10 is a partial cross-sectional view of the assembled vent panel shown in FIG. 1 including a conductive gasket.

In another optional embodiment, electrical continuity between frame pieces 12, 16 and media 14 of vent panel 10 is additionally facilitated with at least one conductive EMI gasket 54 disposed between the frame pieces 12, 16 and media 14. FIG. 10, which a cross-sectional view analogous to FIG. 6, shows at least one conductive gasket 54 disposed between frame piece 16 and media 14. However, an additional conductive gasket 56 (not shown) can also be disposed between frame piece 12 and media 14. Conductive EMI gaskets to be used with the present invention are well known in the art and are widely available from a variety of commercial sources. One such supplier is Laird Technologies, Ltd., located in Delaware Water Gap, Pa. One type of conductive gasket to be used is an electrically conductive foam gasket, which exhibits X, Y and Z-axis conductivity. Conductive gaskets of this type are preferably formed from an open-cell polymeric foam (e.g., polyurethane) that has been rendered conductive. Foam gaskets can be rendered electrically using a variety of techniques known in the art such as metallization or impregnation with a conductive filler. Foam gaskets of this type can also include a fabric sheath to provide abrasion resistance to the gasket.

The invention claimed is:

1. An EMI shielding vent panel adapted for a corresponding aperture in a housing for electronic equipment, said panel comprising:
   - a two-piece, electrically conductive frame having a perimeter defining a closed geometry adapted to enclose said aperture of said housing, each frame piece including a side wall having first and second edges and an end wall extending from each first edge, said side walls having inner and outers surfaces, and wherein said end walls are disposed in an abutting orientation thereby positioning said inner surfaces of said side walls in an opposing orientation;
   - an electrically-conductive media comprising a plurality of ventilation cells extending along a transverse axis intermediate a pair of faces, wherein said cells define a perimeter for said media and said media being disposed intermediate said inner surfaces of said side walls;
   - wherein said frame pieces are secured to each other and to said electrically-conductive media thereby providing electrical contact between said frame and said electrically-conductive media;
   - wherein said end wall providing said outer end wall surface includes a series of spaced-apart lances and said end wall providing said interior end wall surface includes a series of spaced-apart apertures positioned to provide engagement with said lances.

2. The vent panel of claim 1, wherein said frame pieces are secured to said electrically-conductive media through said end walls.

3. The vent panel of claim 1 wherein said frame pieces are secured to said electrically-conductive media through said side walls.

4. The vent panel of claim 3, wherein at least one of said side walls includes a portion extending from said first edge to said second edge being deformed to project into said electrically-conductive media.

5. The vent panel of claim 1, wherein said end walls of said frame pieces are further disposed in an at least partially overlapping orientation, one of said end walls providing an outer end wall surface for said frame where the other of said end walls providing an interior end wall surface facing said electrically-conductive media.

6. The vent panel of claim 1, wherein said ventilation cells are in a honeycomb structure.

7. The vent panel of claim 1, wherein said lances have a semicircular geometry.

8. The vent panel of claim 1, wherein said lances have a polygonal geometry.

9. The vent panel of claim 1, further comprising at least one conductive gasket disposed between said frame pieces and said media to facilitate electrical contact.

10. The vent panel of claim 9, wherein said at least one conductive gasket is comprised of an electrically conductive polymeric foam.

11. The vent panel of claim 10, wherein said electrically conductive polymeric foam is an open cell foam.

* * * * *